US012706129B2

(12) United States Patent
Fu

(10) Patent No.: US 12,706,129 B2
(45) Date of Patent: Aug. 11, 2026

(54) SEMICONDUCTOR APPARATUS, MEMORY, AND ELECTRONIC DEVICE

(71) Applicant: CXMT CORPORATION, Hefei (CN)

(72) Inventor: Chuanjia Fu, Hefei (CN)

(73) Assignee: CXMT CORPORATION, Hefei (CN)

( * ) Notice: Subject to any disclaimer, the term of this patent is extended or adjusted under 35 U.S.C. 154(b) by 159 days.

(21) Appl. No.: 18/822,437

(22) Filed: Sep. 2, 2024

(65) Prior Publication Data

US 2024/0428832 A1 Dec. 26, 2024

Related U.S. Application Data

(63) Continuation of application No. PCT/CN2024/080564, filed on Mar. 7, 2024.

(30) Foreign Application Priority Data

Mar. 31, 2023 (CN) ........................ 202310355174.9

(51) Int. Cl.
*G11C 7/10* (2006.01)

(52) U.S. Cl.
CPC .... *G11C 7/1048* (2013.01); *G11C 2207/2254* (2013.01)

(58) Field of Classification Search
CPC .......... G11C 7/1048; G11C 2207/2254; G11C 11/34
USPC .................................................... 365/189.18
See application file for complete search history.

(56) References Cited

U.S. PATENT DOCUMENTS 6,278,128 B1 * 8/2001 Noji ..................... H10P 74/273 257/738

FOREIGN PATENT DOCUMENTS

| | | | |
|---|---|---|---|
| CN | 102890959 | A | 1/2013 |
| CN | 104112469 | A | 10/2014 |
| CN | 110770831 | A | 2/2020 |
| CN | 111739875 | A | 10/2020 |
| KR | 20130011272 | A | 1/2013 |

* cited by examiner

*Primary Examiner* — Fernando Hidalgo
(74) *Attorney, Agent, or Firm* — Syncoda LLC; Feng Ma

(57) ABSTRACT

A semiconductor apparatus, a memory, and an electronic device are disclosed. At least two chips are included. Each of the chips includes: a fuse circuit, configured to generate a first signal and a second signal through fuse burning, and output the first signal and the second signal; an external pad, configured to receive a third signal input to the chip; and a control circuit, connected to the external pad and the fuse circuit. The control circuit is configured to determine, based on the first signal, the second signal, and the third signal, a sequence of executing a command by the chip in which the control circuit is located in the at least two chips.

15 Claims, 6 Drawing Sheets

SEMICONDUCTOR APPARATUS, MEMORY, AND ELECTRONIC DEVICE

CROSS-REFERENCE TO RELATED APPLICATION

The present disclosure is a US continuation application of International Application No. PCT/CN2024/080564, filed on Mar. 7, 2024, which is based on and claims priority to Chinese Patent Application No. 202310355174.9, filed with the China National Intellectual Property Administration on Mar. 31, 2023 and entitled "SEMICONDUCTOR APPARATUS, MEMORY, AND ELECTRONIC DEVICE". The disclosures of the above applications are hereby incorporated by reference in their entirety.

TECHNICAL FIELD

The present disclosure relates to the field of semiconductor technologies, and relates to but is not limited to a semiconductor apparatus, a memory, and an electronic device.

BACKGROUND

With the continuous development of modern science and technology, semiconductor devices are widely applied to various electronic devices and electronic products. For example, a dynamic random access memory (DRAM), a static random access memory (SRAM), a NAND memory, and the like are semiconductor storage devices commonly utilized in computers.

In recent years, with the increasing demand for large-capacity memory apparatuses in the consumer market, multiple memory chips packaged together may be included in a memory apparatus, and the memory chips may be connected to and communicate with each other through a signal line, a through-silicon via (TSV), a pad, or the like. However, for a current multi-chip package, there are still problems such as relatively poor configuration flexibility of each chip and complex and relatively difficult packaging and manufacturing procedures.

SUMMARY

According to a first aspect, an embodiment of the present disclosure provides a semiconductor apparatus, including at least two chips including a first chip and a second chip. Each of the chips includes: a fuse circuit, configured to generate a first signal and a second signal through fuse burning, and output the first signal and the second signal; an external pad, configured to receive a third signal input to the chip; and a control circuit, connected to the external pad and the fuse circuit. The control circuit is configured to determine, based on the first signal, the second signal, and the third signal, a sequence of executing a command by the chip in which the control circuit is located in at least two chips.

According to a second aspect, an embodiment of the present disclosure provides a memory, including the semiconductor apparatus provided in the foregoing embodiments.

According to a third aspect, an embodiment of the present disclosure provides an electronic device, including the semiconductor apparatus provided in the foregoing embodiments.

The semiconductor apparatus provided in the embodiments of the present disclosure includes the at least two chips, and each chip includes the fuse circuit, the external pad, and the control circuit. The control circuit is configured to determine, based on the first signal and the second signal that are output by the fuse circuit and the third signal output by the external pad, the sequence of executing the command by the chip in which the control circuit is located in the at least two chips. In this way, the sequence of executing the command by the chip in the at least two chips can be configured based on the third signal received from the outside of the chip, so that configurations of multiple chips can be the same during packaging, that is, there is no need to distinguish between the chips based on a specific configuration and perform corresponding packaging. This simplifies packaging and manufacturing procedures, and helps improve flexibility in utilizing each chip.

DESCRIPTION OF EMBODIMENTS

Figure 1:
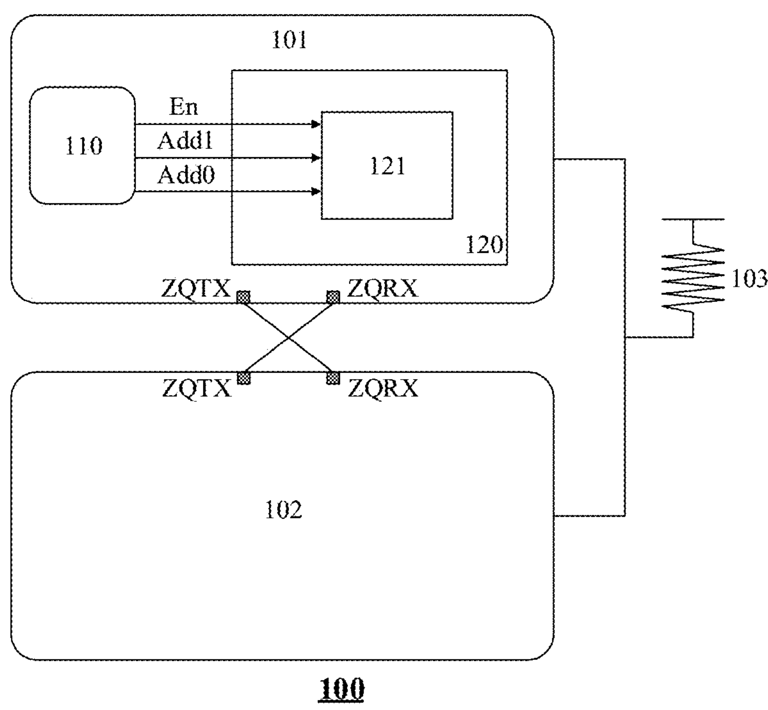
FIG. 1 is a schematic diagram of a semiconductor apparatus according to an embodiment of the present disclosure.

For ease of understanding of the present disclosure, example implementations of the present disclosure are described in more detail below with reference to the related accompanying drawings. Although the example implementations of the present disclosure are shown in the accompanying drawings, it should be understood that the present disclosure may be implemented in various forms without being limited by the specific implementations described herein. Instead, these implementations are provided to implement a more thorough understanding of the present disclosure and to fully convey the scope of the present disclosure to a person skilled in the art.

In the following descriptions, a large quantity of specific details are given to provide a more thorough understanding of the present disclosure. However, it is clear to a person skilled in the art that the present disclosure may be implemented without one or more of these details. In some embodiments, some technical features well-known in the art are not described to avoid confusion with the present disclosure. That is, all features of actual embodiments may not be described herein, and well-known functions and structures may not be described in detail.

Generally, terms may be at least partially understood from the utilization in the context, for example, at least partially depend on the context. For example, the term "one or more" utilized in this specification may be configured to describe any feature, structure, or characteristic in a singular sense, or may be configured to describe a combination of features, structures, or characteristics in a plural sense. Similarly, the terms such as "one" or "the" may also be understood as conveying singular usage or plural usage, at least partially depending on the context. In addition, the term "based on" may be understood as not necessarily intended to convey an exclusive group of factors, and may alternatively allow for the presence of additional factors that are not necessarily explicitly described, which also at least partially depends on the context.

Unless otherwise defined, the terms utilized in this specification are intended merely to describe specific embodiments and are not construed as a limitation to the present disclosure. As utilized herein, "a", "one", and "the" for describing singular forms are also intended to describe plural forms unless otherwise clearly indicated in the context. It should be further understood that the terms "constitute" and/or "include" are utilized in the specification to determine the presence of the features, integers, steps, operations, elements, and/or components, but not rule out the presence or addition of one or more other features, integers, steps, operations, elements, components, and/or groups. As utilized herein, the term "and/or" includes any and all combinations of the related items listed.

For a thorough understanding of the present disclosure, detailed steps and detailed structures are provided in the following descriptions to illustrate the technical solutions of the present disclosure. Preferred embodiments of the present disclosure are described in detail as follows. However, the present disclosure may have other implementations in addition to these detailed descriptions.

In some embodiments, as shown in FIG. 1, a semiconductor apparatus 100 includes at least two chips including a first chip 101 and a second chip 102, and each chip includes a fuse circuit 110 and a control circuit 120. The fuse circuit 110 is configured to generate an enable signal En, a first determining signal Add1, and a second determining signal Add0 through fuse burning, and output the enable signal En, the first determining signal Add1, and the second determining signal Add0. The control circuit 120 includes an arbiter circuit 121, and the arbiter circuit 121 is connected to the fuse circuit 110, and is configured to determine, based on the enable signal En, the first determining signal Add1, and the second determining signal Add0, a sequence of executing a command by the chip in which the control circuit 120 is located in at least two chips.

In this embodiment of the present disclosure, the semiconductor apparatus 100 may be located in a memory, and the memory adjusts impedance of a data input/output circuit in each chip through ZQ calibration, to maintain integrity of a data signal. The chip in the present disclosure may be a die. The first chip 101 and the second chip 102 may be connected to the same calibration resistor 103. The control circuit 120 may be located in a ZQ calibration module in a peripheral circuit of a memory chip, and the arbiter circuit 121 in each chip may determine, based on the enable signal En, the first determining signal Add1, and the second determining signal Add0 that are generated by the fuse circuit 110, a sequence of executing the command by the chip in multiple chips. The command herein may include a ZQ calibration command sent by a memory controller, and the multiple chips may simultaneously receive the ZQ calibration command. For example, the enable signal En generated by the fuse circuit 110 through burning may be configured to enable or disable the arbiter circuit 121, and the first determining signal Add1 and the second determining signal Add0 may be configured to determine a master/slave role of the chip. Specifically, truth values of the foregoing signals and the master/slave role corresponding to the chip are shown in Table 1 in which "0" represents a logic low level and "1" represents a logic high level. It may be understood that master/slave roles of the chips are determined before the multiple chips are packaged because the first determining signal Add1 and the second determining signal Add0 are generated through burning. In some embodiments, quantities of master chips and slave chips in the semiconductor apparatus 100 may be the same.

TABLE 1

Truth values of the signals and the master/slave role corresponding to the chip

| Enable signal | First determining signal | Second determining signal | Master/Slave role |
|---|---|---|---|
| 1 | 0 | 1 | Master chip |
| 1 | 0 | 0 | Slave chip |

In this way, the master chip first performs ZQ calibration through the calibration resistor 103, and the slave chip performs ZQ calibration through the calibration resistor 103 after the master chip completes calibration. For example, the first chip 101 is configured as a master chip and the second chip 102 is configured as a slave chip. When the first chip 101 completes ZQ calibration through the calibration resistor 103, the first chip 101 sends a calibration complete signal to a second calibration pin ZQRX of the second chip 102 through a first calibration pin ZQTX of the first chip 101, so that the second chip 102 starts ZQ calibration. It may be understood that the multiple chips in the semiconductor apparatus 100 may execute the command in a predetermined sequence. For example, multiple master chips may simultaneously perform ZQ calibration, and subsequently multiple slave chips may simultaneously perform ZQ calibration, to improve working efficiency of the memory. It should be noted that there may alternatively be only one master chip in the multiple chips in the semiconductor apparatus 100, and the rest are all slave chips. A command execution sequence between different slave chips is determined based on fuse burning information.

However, because each chip generates the foregoing signal by the fuse circuit in the chip through burning to configure a master/slave role, the master/slave role of each chip is determined before packaging. Therefore, during packaging, a packaging configuration needs to be strictly implemented based on the master/slave role of the chip, which increases packaging difficulty and the possibility that an error occurs. Furthermore, chips with different configurations need to be manufactured, and the quantities of master chips and slave chips need to be theoretically consistent. Therefore, the quantity of fuse units in the chip needs to be controlled, and marks need to be made to distinguish between the master chip and the slave chip. In this case, an unnecessary manufacturing control procedure is added, and manufacturing difficulty is increased. In addition, because the master/slave role is defined for each chip, flexibility in utilizing each chip is relatively low.

Figure 2:
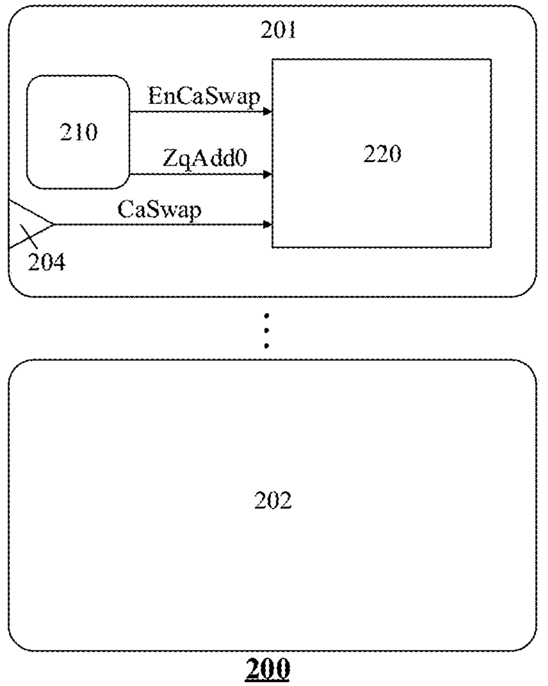
FIG. 2 is a schematic diagram of another semiconductor apparatus according to an embodiment of the present disclosure.

According to a first aspect, as shown in FIG. 2, an embodiment of the present disclosure provides a semiconductor apparatus 200, including at least two chips including a first chip 201 and a second chip 202. Each of the chips includes: a fuse circuit 210, configured to generate a first signal EnCaSwap and a second signal ZqAdd0 through fuse burning, and output the first signal EnCaSwap and the second signal ZqAdd0; an external pad 204, configured to receive a third signal CaSwap input to the chip; and a control circuit 220, connected to the external pad 204 and the fuse circuit 210. The control circuit 220 is configured to determine, based on the first signal EnCaSwap, the second signal ZqAdd0, and the third signal CaSwap, a sequence of executing a command by the chip in which the control circuit 220 is located in at least two chips.

In this embodiment of the present disclosure, the semiconductor apparatus 200 may be located in a memory, and the first chip 201 and the second chip 202 may be connected to the same calibration resistor. In each chip, the fuse circuit 210 may generate the first signal EnCaSwap and the second signal ZqAdd0 through fuse burning, and output the first signal EnCaSwap and the second signal ZqAdd0, the external pad 204 may receive the third signal CaSwap from the outside of the chip, and the control circuit 220 may be located in a ZQ calibration module in a peripheral circuit of a memory chip. The second signal ZqAdd0 herein may correspond to the second determining signal in the foregoing embodiment, and the third signal CaSwap may be configured to swap a pin order of command address signals input to the chip.

For example, the control circuit 220 may choose, based on a level of the first signal EnCaSwap, to determine, based on the second signal ZqAdd0 or the third signal CaSwap, the sequence of executing the command by the chip in the at least two chips. The command herein may include a ZQ calibration command sent by a memory controller, and the multiple chips may simultaneously receive the ZQ calibration command. For example, the control circuit 220 in each chip may determine a master/slave role of the chip based on the third signal CaSwap from the outside of the chip when the level of the first signal EnCaSwap generated by the fuse circuit 210 in each chip in the semiconductor apparatus 200 is high. A master chip may execute the corresponding command before a slave chip. That is, the master chip first performs ZQ calibration through a calibration resistor, and the slave chip performs ZQ calibration through the calibration resistor after the master chip completes calibration. In this way, levels of first signals EnCaSwap generated by fuse circuits 210 in chips through burning may be the same, and levels of second signals ZqAdd0 generated by the fuse circuits 210 in the chips through burning may be the same, that is, configurations of the chips in the semiconductor apparatus 200 may be the same, and there is no difference between the chips. Therefore, in manufacturing and packaging processes of the chip, the master/slave role of the chip does not need to be considered. This helps simplify packaging and manufacturing procedures, and improves flexibility in utilizing each chip.

The control circuit 220 in each chip may alternatively determine a master/slave role of the chip based on the second signal ZqAdd0 generated by the fuse circuit 210 through burning when the level of the first signal EnCaSwap generated by the fuse circuit 210 in each chip in the semiconductor apparatus 200 is low. In this way, configurations of the multiple chips may be different, and attention needs to be paid to the master/slave role of each chip in manufacturing and packaging processes. That is, this embodiment is compatible with the solution in the embodiment corresponding to FIG. 1, to meet different requirements in actual utilization.

In some embodiments, ZQ calibration may include two processes: pull-up calibration and pull-down calibration. For example, the chip first performs pull-down calibration through the calibration resistor, to calibrate impedance of a pull-down circuit, and then performs pull-up calibration through the pull-down circuit, to calibrate impedance of a pull-up circuit. In this way, in the semiconductor apparatus 200 provided in the present disclosure, the slave chip may start to perform pull-down calibration after the master chip completes pull-down calibration. That is, the slave chip may simultaneously perform pull-down calibration in a process of performing pull-up calibration by the master chip, to reduce a ZQ calibration time.

In some embodiments, the fuse circuit 210 is further configured to adjust, through the first signal EnCaSwap, a pin order of multiple command address signals input to the chip.

In this embodiment of the present disclosure, multiple chips in the semiconductor apparatus 200 may be packaged on a substrate, the substrate has pins configured to transmit the multiple command address signals, and each chip also has corresponding pins configured to receive the multiple command address signals. When an order of the command address signals transmitted by the pins of the substrates is different from an order of the command address signals received by the pins of the chip, the first signal EnCaSwap may be configured to adjust the pin order of the multiple command address signals input to the chip. For example, the level of the first signal EnCaSwap generated by the fuse circuit 210 in the chip may be high if the order of the command address signals transmitted by the pins of the substrate is CA [5:0] and the order of the command address signals received by the pins of the chip is CA [0:5], to swap the pin order of the command address signals input to the chip.

Figure 3:
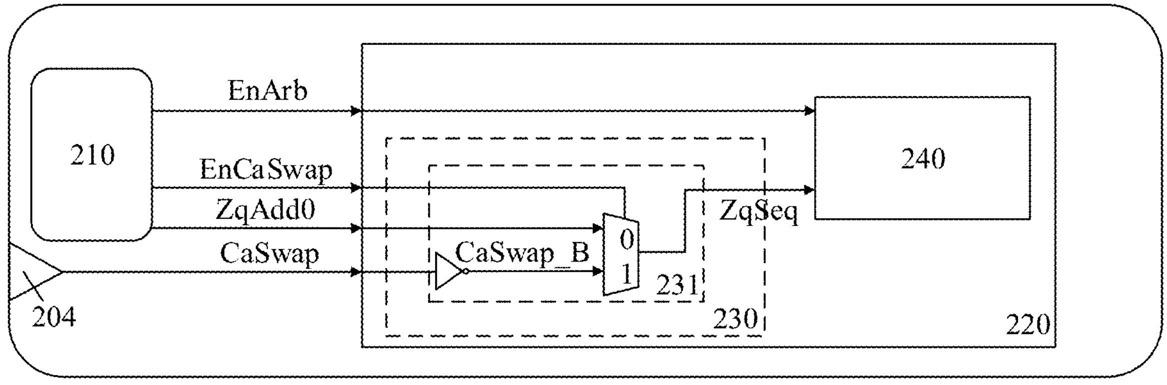
FIG. 3 is a schematic diagram of a control circuit in another semiconductor apparatus according to an embodiment of the present disclosure.

In some embodiments, as shown in FIG. 3, the control circuit 220 includes: a master/slave determining circuit 230, configured to determine a master/slave type of the chip based on the first signal EnCaSwap, the second signal ZqAdd0, and the third signal CaSwap, and output a master/slave determining signal ZqSeq; and an arbiter circuit 240, connected to the master/slave determining circuit 230. The arbiter circuit 240 is configured to determine, based on the master/slave determining signal ZqSeq, the sequence of executing the command by the chip in which the arbiter circuit 240 is located in the at least two chips.

In this embodiment of the present disclosure, the control circuit 220 includes the master/slave determining circuit 230 and the arbiter circuit 240. An input end of the master/slave determining circuit 230 is connected to the fuse circuit 210 and the external pad 204, and the master/slave determining circuit 230 is configured to determine the master/slave type of the chip based on the first signal EnCaSwap, the second signal ZqAdd0, and the third signal CaSwap, and output the master/slave determining signal ZqSeq. An input end of the arbiter circuit 240 is connected to an output end of the master/slave determining circuit 230, and the arbiter circuit 240 may determine, based on a level of the master/slave determining signal ZqSeq, the sequence of executing the command by the chip in the at least two chips. For example, when the level of the first signal EnCaSwap is high, the master/slave determining circuit 230 determines the master/slave type of the chip based on the third signal CaSwap, and outputs a master/slave determining signal ZqSeq at a level opposite to that of the third signal CaSwap. When the level of the first signal EnCaSwap is low, the master/slave determining circuit 230 determines the master/slave type of the chip based on the second signal ZqAdd0, and outputs a master/slave determining signal ZqSeq at a level the same as that of the second signal ZqAdd0. In this way, the arbiter circuit 240 may control the chip to preferentially execute the corresponding command, for example, perform ZQ calibration when the level of the master/slave determining signal ZqSeq is high, that is, the chip is determined as a master chip; or the arbiter circuit 240 may control the chip to execute the corresponding command after the master chip when the level of the master/slave determining signal ZqSeq is low, that is, the chip is determined as a slave chip.

In some embodiments, as shown in FIG. 3, the fuse circuit 210 is further configured to generate a sixth signal EnArb through fuse burning, and output the sixth signal EnArb. The arbiter circuit 240 is further connected to the fuse circuit 210, and the fuse circuit 210 is further configured to enable or disable the arbiter circuit 240 through the sixth signal EnArb.

In this embodiment of the present disclosure, the fuse circuit 210 may further generate the sixth signal EnArb through fuse burning, and output the sixth signal EnArb. The sixth signal herein may be the same as the enable signal in the foregoing embodiment. The arbiter circuit 240 may be further connected to the fuse circuit 210, and the fuse circuit 210 may enable or disable the arbiter circuit 240 through the sixth signal EnArb. For example, the arbiter circuit 240 is enabled when a level of the sixth signal EnArb is high; and the arbiter circuit 240 is disabled when the level of the sixth signal EnArb is low. In this way, the arbiter circuit 240 can be turned off in a specific time period, to reduce power consumption of the chip.

In some embodiments, as shown in FIG. 3, the master/slave determining circuit 230 includes a selection circuit 231, configured to output the second signal ZqAdd0 or a fourth signal CaSwap_B at a level opposite to that of the third signal CaSwap as the master/slave determining signal ZqSeq based on the first signal EnCaSwap.

In this embodiment of the present disclosure, the selection circuit 231 is located in the master/slave determining circuit 230. When the level of the first signal EnCaSwap is high, the selection circuit 231 determines the master/slave type of the chip based on the third signal CaSwap, and outputs the fourth signal CaSwap_B at a level opposite to that of the third signal CaSwap as the master/slave determining signal ZqSeq. When the level of the first signal EnCaSwap is low, the selection circuit 231 determines the master/slave type of the chip based on the second signal ZqAdd0, and outputs the second signal ZqAdd0 as the master/slave determining signal ZqSeq. Table 2 provides examples of truth values of the first signal EnCaSwap, the second signal ZqAdd0, the third signal CaSwap, the fourth signal CaSwap_B, and the sixth signal EnArb, and the master/slave role corresponding to the chip.

TABLE 2

Truth values of the signals and the master/slave role corresponding to the chip

| First signal EnCaSwap | Second signal ZqAdd0 | Third signal CaSwap | Fourth signal CaSwap_B | Sixth signal EnArb | Master/Slave determining signal ZqSeq | Master/Slave role |
|---|---|---|---|---|---|---|
| 0 | 1 | 0 | 1 | 1 | 1 | Master chip |
| 0 | 0 | 1 | 0 | 1 | 0 | Slave chip |
| 1 | 0 | 0 | 1 | 1 | 1 | Master chip |
| 1 | 0 | 1 | 0 | 1 | 0 | Slave chip |

Figure 4:
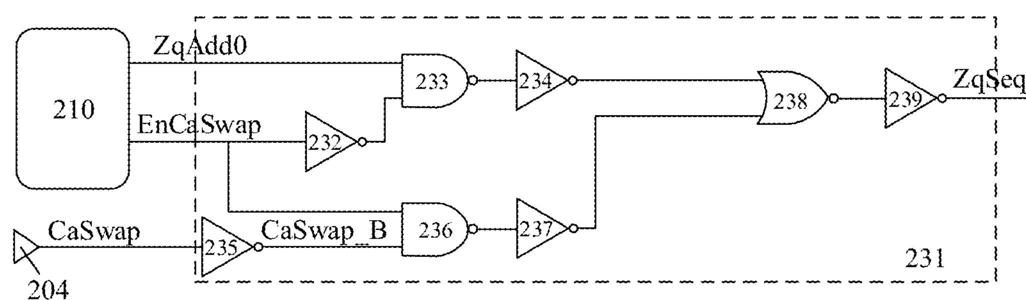
FIG. 4 is a schematic diagram of a selection circuit in another semiconductor apparatus according to an embodiment of the present disclosure.

In some embodiments, as shown in FIG. 4, a first output end of the fuse circuit 210 is configured to output the first signal EnCaSwap, and a second output end of the fuse circuit 210 is configured to output the second signal ZqAdd0. The selection circuit 231 includes: a first inverter 232, an input end of the first inverter 232 being connected to the first output end of the fuse circuit 210; a first NAND gate 233, a first input end of the first NAND gate 233 being connected to the second output end of the fuse circuit 210, and a second input end of the first NAND gate 233 being connected to an output end of the first inverter 232; a second inverter 234, an input end of the second inverter 234 being connected to an output end of the first NAND gate 233; a third inverter 235, connected to the external pad 204 and configured to output the fourth signal CaSwap_B at a level opposite to that of the third signal CaSwap; a second NAND gate 236, a first input end of the second NAND gate 236 being connected to the first output end of the fuse circuit 210, and a second input end of the second NAND gate 236 being connected to an output end of the third inverter 235; a fourth inverter 237, an input end of the fourth inverter 237 being connected to an output end of the second NAND gate 236; a first NOR gate 238, a first input end of the first NOR gate 238 being connected to an output end of the second inverter 234, and a second input end of the first NOR gate 238 being connected to an output end of the fourth inverter 237; and a fifth inverter 239, an input end of the fifth inverter 239 being connected to an output end of the first NOR gate 238, and an output end of the fifth inverter 239 being configured to output the master/slave determining signal ZqSeq.

In this embodiment of the present disclosure, the fuse circuit 210 may include the first output end configured to output the first signal EnCaSwap and the second output end configured to output the second signal ZqAdd0. The selection circuit 231 specifically includes the first inverter 232, the first NAND gate 233, the second inverter 234, the third inverter 235, the second NAND gate 236, the fourth inverter 237, the first NOR gate 238, and the fifth inverter 239. A connection relationship between components in the selection circuit 231 is shown in FIG. 4. Details are not described herein again. In this way, the selection circuit 231 may output the second signal ZqAdd0 or the fourth signal CaSwap_B at a level opposite to that of the third signal CaSwap as the master/slave determining signal ZqSeq based on the first signal EnCaSwap. For specific truth values of the signals and the master/slave role corresponding to the chip, refer to Table 2.

It may be understood that when the level of the first signal EnCaSwap generated by the fuse circuit 210 in each chip is high, the level of the master/slave determining signal ZqSeq output by the selection circuit 231 is opposite to that of the third signal CaSwap from the outside of the chip. That is, in this case, levels of first signals EnCaSwap generated by fuse circuits 210 in chips through burning may be the same, and levels of second signals ZqAdd0 generated by the fuse circuits 210 in the chips through burning may be the same, that is, configurations of the chips in the semiconductor apparatus may be the same, and there is no difference between the chips. Therefore, in manufacturing and packaging processes of the chip, neither the master/slave role of the chip needs to be considered, nor a quantity ratio of master and slave chips in a package needs to be considered. This helps simplify packaging and manufacturing procedures. In addition, there is no difference between the chips, and each chip may serve as a master chip, or may serve as a slave chip. This greatly improves flexibility in combining multiple chips.

Figure 5:
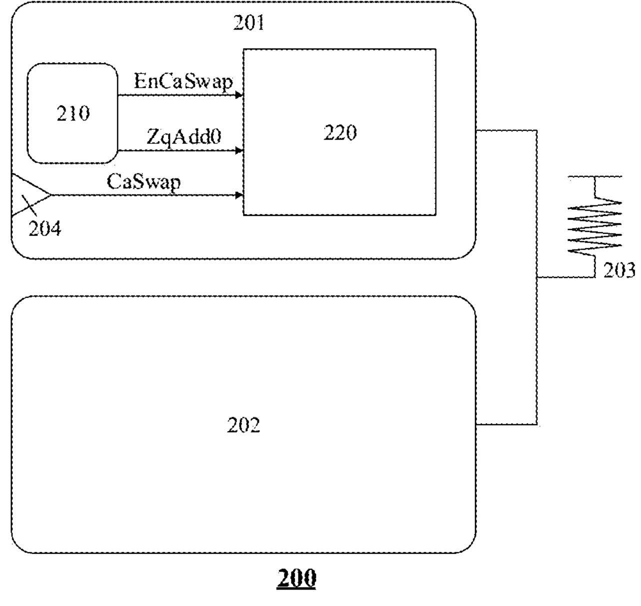
FIG. 5 is a schematic diagram of a first calibration resistor in another semiconductor apparatus according to an embodiment of the present disclosure.

In some embodiments, as shown in FIG. 5, the semiconductor apparatus 200 further includes a first calibration resistor 203, both the first chip 201 and the second chip 202 are coupled to the first calibration resistor 203, and the first chip 201 and the second chip 202 are configured to perform a resistance calibration operation through the first calibration resistor 203.

In this embodiment of the present disclosure, the first chip 201 and the second chip 202 are jointly connected to the first calibration resistor 203. That is, both the first chip 201 and the second chip 202 perform ZQ calibration through the first calibration resistor 203. In this way, a master chip in the first chip 201 and the second chip 202 first performs ZQ calibration through the first calibration resistor 203, and after the master chip completes calibration, a slave chip performs ZQ calibration through the first calibration resistor 203.

In some embodiments, the arbiter circuit 240 determines that the chip in which the arbiter circuit 240 is located is the first one performing the resistance calibration operation when the master/slave determining circuit 230 determines that the chip in which the master/slave determining circuit 230 is located is a master chip and outputs the master/slave determining signal ZqSeq at a first level; or the arbiter circuit 240 determines that the chip in which the arbiter circuit 240 is located is the second one performing the resistance calibration operation when the master/slave determining circuit 230 determines that the chip in which the master/slave determining circuit 230 is located is a slave chip and outputs the master/slave determining signal ZqSeq at a second level.

For example, when determining that the chip is a master chip, the master/slave determining circuit 230 simultaneously outputs a master/slave determining signal ZqSeq at a high level, and in this case, the arbiter circuit 240 controls, based on the master/slave determining signal ZqSeq at a high level, the chip to be the first one to perform the ZQ calibration operation; or when determining that the chip is a slave chip, the master/slave determining circuit 230 simultaneously outputs a master/slave determining signal ZqSeq at a low level, and in this case, the arbiter circuit 240 controls, based on the master/slave determining signal ZqSeq at a low level, the chip to be the second one to perform the ZQ calibration operation. It may be understood that the "first level" may alternatively be a low level, and the "second level" may alternatively be a high level. This is not limited herein.

Figure 6:
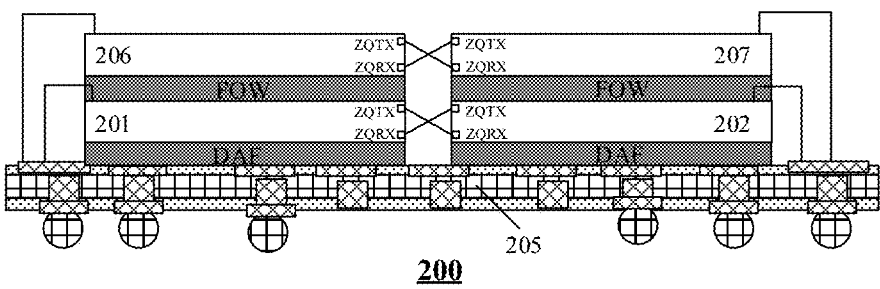
FIG. 6 is a schematic diagram of a third chip and a fourth chip in another semiconductor apparatus according to an embodiment of the present disclosure.

In some embodiments, as shown in FIG. 6, the semiconductor apparatus 200 further includes a substrate 205, a third chip 206, and a fourth chip 207. The first chip 201 and the second chip 202 are located on the same plane of the substrate 205, the third chip 206 is stacked on the first chip 201, and the fourth chip 207 is stacked on the second chip 202. Each of the chips includes a first calibration pin ZQTX and a second calibration pin ZQRX. The first calibration pin ZQTX is configured to output a calibration complete signal when the chip completes the resistance calibration operation, and the second calibration pin ZQRX is configured to receive, when another chip completes the resistance calibration operation, the calibration complete signal output by the another chip. The first calibration pin ZQTX of the first chip 201 is connected to the second calibration pin ZQRX of the second chip 202, and the second calibration pin ZQRX of the first chip 201 is connected to the first calibration pin ZQTX of the second chip 202. The first calibration pin ZQTX of the third chip 206 is connected to the second calibration pin ZQRX of the fourth chip 207, and the second calibration pin ZQRX of the third chip 206 is connected to the first calibration pin ZQTX of the fourth chip 207.

In this embodiment of the present disclosure, the semiconductor apparatus 200 includes the substrate 205, the first chip 201, the second chip 202, the third chip 206, and the fourth chip 207. The first chip 201 and the second chip 202 are located on the substrate 205, and the third chip 206 and the fourth chip 207 are respectively stacked on the first chip 201 and the second chip 202. The first chip 201 and the second chip 202 may be a pair of chips that have a master-slave relationship, and the third chip 206 and the fourth chip 207 may be a pair of chips that have a master-slave relationship. In this way, after the master chip completes ZQ calibration, the master chip can output a calibration complete signal through a first calibration pin ZQTX of the master chip, and the slave chip can receive, through a second calibration pin ZQRX of the slave chip, the calibration complete signal output by the master chip. Therefore, the slave chip can perform ZQ calibration after the master chip completes ZQ calibration. It may be understood that each chip has the first calibration pin ZQTX and the second calibration pin ZQRX. Therefore, each chip can be configured as a master chip, and output the calibration complete signal through the first calibration pin ZQTX, or can be configured as a slave chip, and receive the calibration complete signal through the second calibration pin ZQRX.

In some embodiments, there may be a die attach film (DAF) between the first chip 201 and the substrate 205 and between the second chip 202 and the substrate 205, to enhance connection strength between the chip and the substrate; and there may be a film over wire (FOW) between the third chip 206 and the first chip 201 and between the fourth chip 207 and the second chip 202, to enhance connection strength between the two layers of stacked chips.

Figure 7:
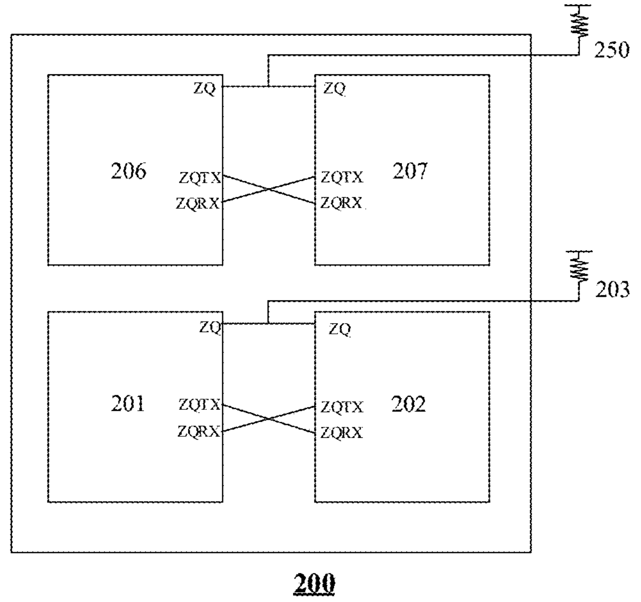
FIG. 7 is a schematic diagram of a second calibration resistor in another semiconductor apparatus according to an embodiment of the present disclosure.

In some embodiments, as shown in FIG. 7, the semiconductor apparatus further includes a second calibration resistor 250, both the third chip 206 and the fourth chip 207 are coupled to the second calibration resistor 250, and the third chip 206 and the fourth chip 207 are configured to perform the resistance calibration operation through the second calibration resistor 250.

In this embodiment of the present disclosure, the first chip 201 and the second chip 202 are jointly connected to the first calibration resistor 203, and the third chip 206 and the fourth chip 207 are jointly connected to the second calibration resistor 250. That is, both the first chip 201 and the second chip 202 perform ZQ calibration through the first calibration resistor 203, and both the third chip 206 and the fourth chip 207 perform ZQ calibration through the second calibration resistor 250. In this way, two chips share one calibration resistor. Therefore, each chip can determine, through only a 1-bit signal (that is, a signal with only two states of "0" or "1"), a sequence of performing calibration by the chip in the two chips. For example, an arbiter circuit in each chip may determine, through a 1-bit master/slave determining signal, whether the chip is the first one performing ZQ calibration (a master chip) or the second one performing ZQ calibration (a slave chip).

In this way, when the semiconductor apparatus 200 includes four chips, the chips can be configured based on the foregoing embodiment, that is, two chips are connected to one calibration resistor, and the other two chips are connected to another calibration resistor, to perform ZQ calibration on the chips in a proper order.

Figure 8:
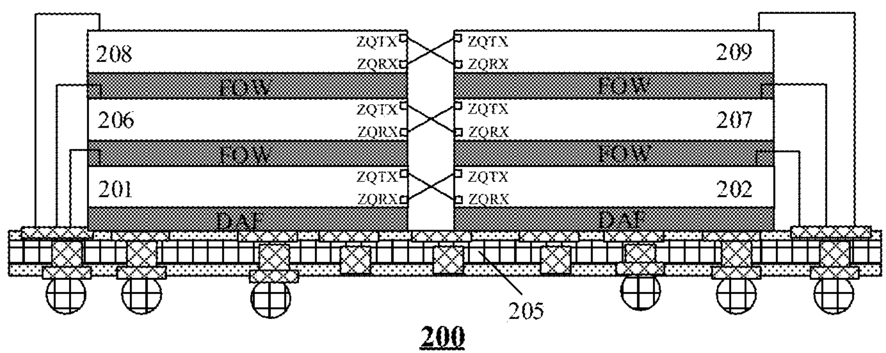
FIG. 8 is a schematic diagram of a fifth chip and a sixth chip in another semiconductor apparatus according to an embodiment of the present disclosure.
Figure 9:
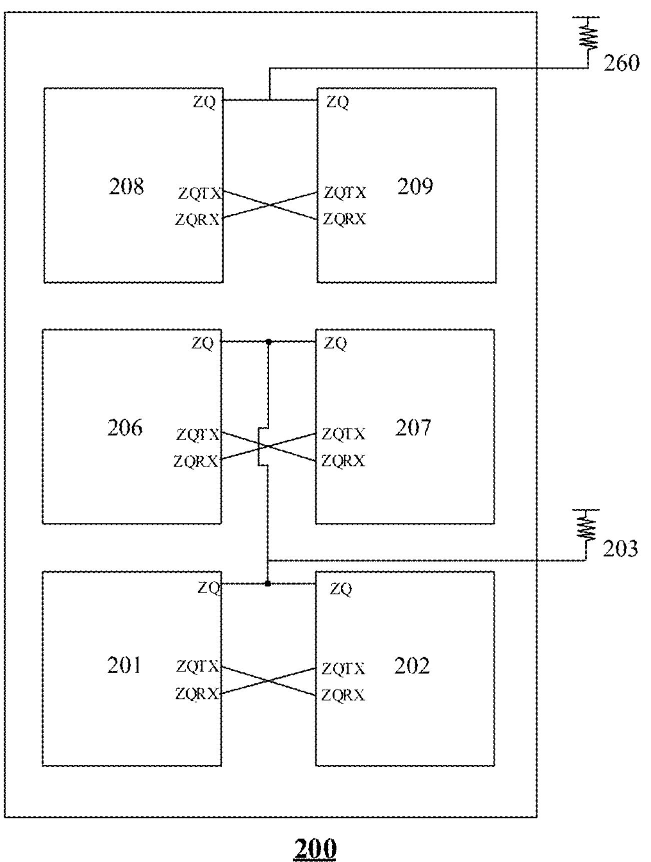
FIG. 9 is a schematic diagram of a third calibration resistor in another semiconductor apparatus according to an embodiment of the present disclosure.

In some embodiments, as shown in FIG. 8, the semiconductor apparatus 200 further includes a fifth chip 208, a sixth chip 209, and a third calibration resistor 260. The fifth chip 208 is stacked on the third chip 206, and the sixth chip 209 is stacked on the fourth chip 207. As shown in FIG. 9, all of the first chip 201, the second chip 202, the third chip 206, and the fourth chip 207 are coupled to the first calibration resistor 203; and both the fifth chip 208 and the sixth chip 209 are coupled to the third calibration resistor 260. The first chip 201, the second chip 202, the third chip 206, and the fourth chip 207 are configured to perform the resistance calibration operation through the first calibration resistor 203. The fifth chip 208 and the sixth chip 209 are configured to perform the resistance calibration operation through the third calibration resistor 260.

In this embodiment of the present disclosure, the first chip 201, the second chip 202, the third chip 206, and the fourth chip 207 are jointly connected to the first calibration resistor 203, and the fifth chip 208 and the sixth chip 209 are jointly connected to the third calibration resistor 260. In this way, any chip in the fifth chip 208 and the sixth chip 209 can determine, through only a 1-bit signal (that is, a signal with only two states of "0" or "1"), a sequence of performing calibration by the chip in the two chips. However, any chip in the first chip 201, the second chip 202, the third chip 206, and the fourth chip 207 needs to determine, through a 2-bit signal (that is, a signal with four states of "00", "01", "10", and "11"), a sequence of performing calibration by the chip in the four chips. That is, in addition to a 1-bit master/slave determining signal, the any chip in the first chip 201, the second chip 202, the third chip 206, and the fourth chip 207 further needs another 1-bit signal to determine the sequence of performing ZQ calibration by the chip.

Figure 10:
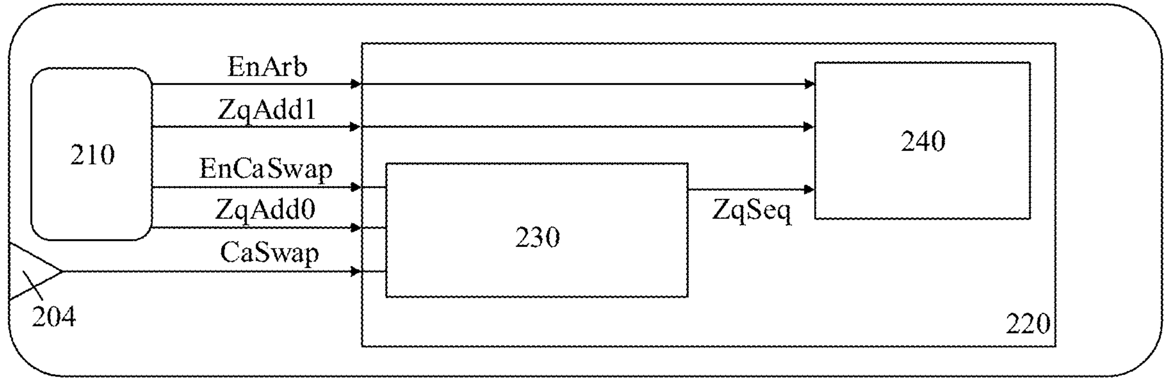
FIG. 10 is a schematic diagram of still another semiconductor apparatus according to an embodiment of the present disclosure.

In some embodiments, as shown in FIG. 10, the fuse circuit 210 is further configured to generate a fifth signal ZqAdd1 through fuse burning, and output the fifth signal ZqAdd1. The arbiter circuit 240 is further connected to the fuse circuit 210, and the arbiter circuit 240 is further configured to determine, based on the master/slave determining signal ZqSeq and the fifth signal ZqAdd1, a sequence of executing the command by the chip in which the arbiter circuit 240 is located in multiple chips.

In this embodiment of the present disclosure, the fuse circuit 210 may further generate the fifth signal ZqAdd1 through burning, and output the fifth signal ZqAdd1. The arbiter circuit 240 is further connected to the fuse circuit 210, and receives the fifth signal ZqAdd1 and the master/slave determining signal ZqSeq, to determine the sequence of executing the command by the chip in the multiple chips. That is, the fifth signal ZqAdd1 and the master/slave determining signal ZqSeq may jointly constitute a 2-bit signal, to determine a sequence of performing ZQ calibration by the chip in four chips connected to the same calibration resistor.

In some embodiments, the arbiter circuit 240 determines that the chip in which the arbiter circuit is located is the first one performing the resistance calibration operation when the master/slave determining signal ZqSeq is at a first level and the fifth signal ZqAdd1 is at the first level; the arbiter circuit 240 determines that the chip in which the arbiter circuit is located is the second one performing the resistance calibration operation when the master/slave determining signal ZqSeq is at a first level and the fifth signal ZqAdd1 is at a second level; the arbiter circuit 240 determines that the chip in which the arbiter circuit is located is the third one performing the resistance calibration operation when the master/slave determining signal ZqSeq is at a second level and the fifth signal ZqAdd1 is at a first level; or the arbiter circuit 240 determines that the chip in which the arbiter circuit is located is the fourth one performing the resistance calibration operation when the master/slave determining signal ZqSeq is at a second level and the fifth signal ZqAdd1 is at the second level.

In this embodiment of the present disclosure, the fifth signal ZqAdd1 and the master/slave determining signal ZqSeq may constitute a 2-bit signal with four states of "00", "01", "10", and "11", so that the arbiter circuit 240 can determine the sequence of performing ZQ calibration by the chip in the four chips connected to the same calibration resistor. For example, Table 3 shows truth values of the first signal EnCaSwap, the second signal ZqAdd0, the third signal CaSwap, the master/slave determining signal ZqSeq, and the fifth signal ZqAdd1, and the corresponding sequence of performing resistance calibration by the chip in the four chips. It may be understood that the "first level" may alternatively be a low level, and the "second level" may alternatively be a high level. This is not limited herein.

TABLE 3

Truth values of the signals and the corresponding sequence of performing resistance calibration by the chip

| First signal EnCaSwap | Second signal ZqAdd0 | Third signal CaSwap | Master/Slave determining signal ZqSeq | Fifth signal ZqAdd1 | Sequence of executing the command |
|---|---|---|---|---|---|
| 0 | 1 | 0 | 1 | 1 | First |
| 0 | 0 | 1 | 0 | 1 | Third |
| 0 | 1 | 0 | 1 | 0 | Second |
| 0 | 0 | 1 | 0 | 0 | Fourth |
| 1 | 0 | 0 | 1 | 1 | First |
| 1 | 0 | 1 | 0 | 1 | Third |
| 1 | 0 | 0 | 1 | 0 | Second |
| 1 | 0 | 1 | 0 | 0 | Fourth |

In this way, when the semiconductor apparatus 200 includes six chips, the chips can be configured based on the foregoing embodiment, that is, two chips are connected to one calibration resistor, and the other four chips are connected to another calibration resistor, to perform ZQ calibration on the chips in a proper order.

Figure 11:
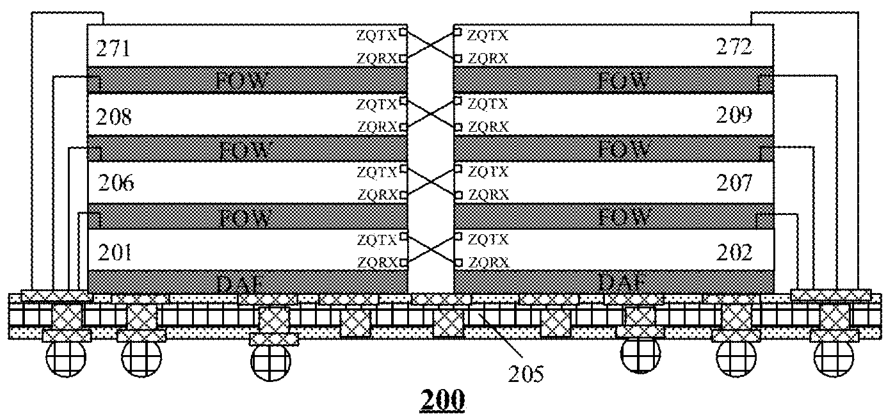
FIG. 11 is a schematic diagram of a seventh chip and an eighth chip in still another semiconductor apparatus according to an embodiment of the present disclosure.
Figure 12:
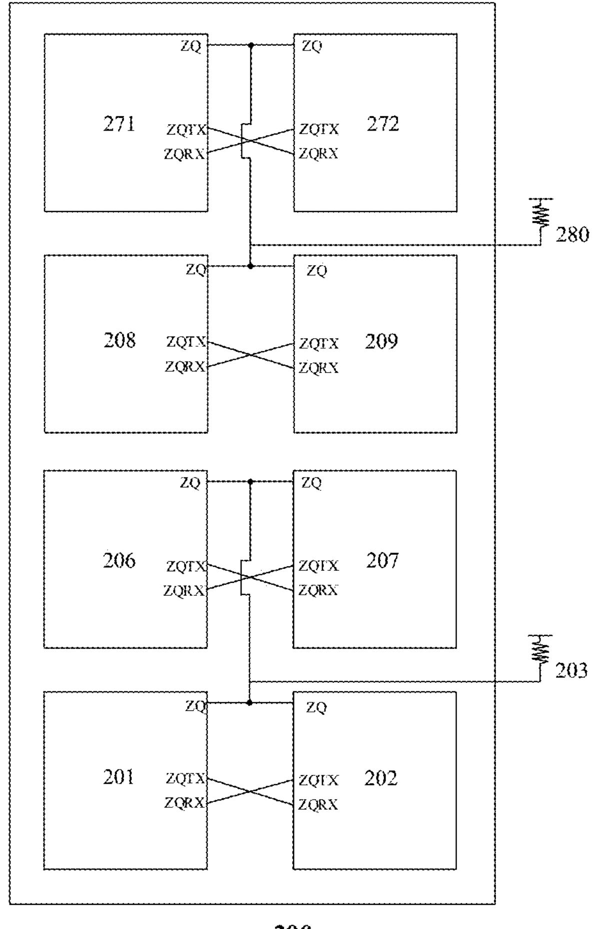
FIG. 12 is a schematic diagram of a fourth calibration resistor in still another semiconductor apparatus according to an embodiment of the present disclosure.

In some embodiments, as shown in FIG. 11, the semiconductor apparatus 200 further includes a seventh chip 271 stacked on the fifth chip 208 and an eighth chip 272 stacked on the sixth chip 209. For example, as shown in FIG. 12, the first chip 201, the second chip 202, the third chip 206, and the fourth chip 207 are jointly connected to the first calibration resistor 203, and the fifth chip 208, the sixth chip 209, the seventh chip 271, and the eighth chip 272 are jointly connected to a fourth calibration resistor 280. Similarly, a combination of the fifth signal ZqAdd1 and the master/slave determining signal ZqSeq may be configured to constitute a 2-bit signal with four states of "00", "01", "10", and "11", to determine a sequence of performing ZQ calibration by four chips connected to the same calibration resistor.

In this way, when the semiconductor apparatus 200 includes eight chips, the chips can be configured based on the foregoing embodiment, that is, four chips are connected to one calibration resistor, and the other four chips are connected to another calibration resistor, to perform ZQ calibration on the chips in a proper order.

According to a second aspect, an embodiment of the present disclosure provides a memory, including the semiconductor apparatus according to any one of the foregoing embodiments.

In this embodiment of the present disclosure, the memory includes but is not limited to a dynamic random access memory (DRAM), a static random access memory (SRAM), a ferroelectric random access memory (FRAM), a magnetoresistive random access memory (MRAM), a phase change random access memory (PCRAM), a resistive random access memory (RRAM), a nano random access memory (NRAM), and the like. In some embodiments, the memory may alternatively be a nonvolatile memory such as a flash memory. The memory may include the semiconductor apparatus according to any one of the foregoing embodiments. In this way, a sequence of executing a command by a chip in at least two chips can be configured based on a third signal received from the outside of the chip, so that configurations of multiple chips can be the same during packaging, that is, there is no need to distinguish between the chips based on a specific configuration and perform corresponding packaging. This simplifies packaging and manufacturing procedures, and helps improve flexibility in utilizing each chip.

According to a third aspect, an embodiment of the present disclosure provides an electronic device, including the semiconductor apparatus according to any one of the foregoing embodiments.

In this embodiment of the present disclosure, the electronic device includes but is not limited to a mobile phone, a desktop computer, a notebook computer, a tablet computer, a vehicle computer, a game console, a printer, a positioning device, a wearable electronic device, an intelligent sensor, a virtual reality (VR) device, an augmented reality (AR) device, and the like, and the electronic device includes the semiconductor apparatus according to any one of the foregoing embodiments.

It should be noted that the features disclosed in the several method or device embodiments provided in the present disclosure may be randomly combined when there is no conflict, to obtain new method embodiments or new device embodiments.

The foregoing descriptions are merely specific implementations of the present disclosure, but are not intended to limit the protection scope of the present disclosure. Any variation or replacement readily figured out by a person skilled in the art within the technical scope disclosed in the present disclosure shall fall within the protection scope of the present disclosure. Therefore, the protection scope of the present disclosure shall be subject to the protection scope of the claims.

What is claimed is:

1. A semiconductor apparatus, comprising:

at least two chips comprising a first chip and a second chip, each of the chips comprising:

a fuse circuit, configured to generate a first signal and a second signal through fuse burning, and output the first signal and the second signal;

an external pad, configured to receive a third signal input to the chip; and a control circuit, connected to the external pad and the fuse circuit, the control circuit being configured to determine, based on the first signal, the second signal, and the third signal, a sequence of executing a command by the chip in which the control circuit is located in at least two chips.

2. The semiconductor apparatus according to claim 1, wherein the control circuit comprises:

a master/slave determining circuit, configured to determine a master/slave type of the chip based on the first signal, the second signal, and the third signal, and output a master/slave determining signal; and an arbiter circuit, connected to the master/slave determining circuit, the arbiter circuit being configured to determine, based on the master/slave determining signal, the sequence of executing the command by the chip in which the arbiter circuit is located in the at least two chips.

3. The semiconductor apparatus according to claim 2, wherein the master/slave determining circuit comprises a selection circuit, configured to output the second signal or a fourth signal at a level opposite to that of the third signal as the master/slave determining signal based on the first signal.

4. The semiconductor apparatus according to claim 3, wherein a first output end of the fuse circuit is configured to output the first signal, a second output end of the fuse circuit is configured to output the second signal, and the selection circuit comprises:

a first inverter, an input end of the first inverter being connected to the first output end of the fuse circuit;

a first NAND gate, a first input end of the first NAND gate being connected to the second output end of the fuse circuit, and a second input end of the first NAND gate being connected to an output end of the first inverter;

a second inverter, an input end of the second inverter being connected to an output end of the first NAND gate;

a third inverter, connected to the external pad and configured to output the fourth signal at the level opposite to that of the third signal;

a second NAND gate, a first input end of the second NAND gate being connected to the first output end of the fuse circuit, and a second input end of the second NAND gate being connected to an output end of the third inverter;

a fourth inverter, an input end of the fourth inverter being connected to an output end of the second NAND gate;

a first NOR gate, a first input end of the first NOR gate being connected to an output end of the second inverter, and a second input end of the first NOR gate being connected to an output end of the fourth inverter; and a fifth inverter, an input end of the fifth inverter being connected to an output end of the first NOR gate, and an output end of the fifth inverter being configured to output the master/slave determining signal.

5. The semiconductor apparatus according to claim 2, wherein the semiconductor apparatus further comprises a first calibration resistor, both the first chip and the second chip are coupled to the first calibration resistor, and the first chip and the second chip are configured to perform a resistance calibration operation through the first calibration resistor.

6. The semiconductor apparatus according to claim 5, wherein the arbiter circuit determines that the chip in which the arbiter circuit is located is the first one performing the resistance calibration operation when the master/slave determining circuit determines that the chip in which the master/slave determining circuit is located is a master chip and outputs the master/slave determining signal at a first level; or the arbiter circuit determines that the chip in which the arbiter circuit is located is the second one performing the resistance calibration operation when the master/slave determining circuit determines that the chip in which the master/slave determining circuit is located is a slave chip and outputs the master/slave determining signal at a second level.

7. The semiconductor apparatus according to claim 5, wherein the semiconductor apparatus further comprises:

a substrate, a third chip, and a fourth chip; the first chip and the second chip are located on a same plane of the substrate, the third chip is stacked on the first chip, and the fourth chip is stacked on the second chip;

each of the chips comprises a first calibration pin and a second calibration pin; the first calibration pin is configured to output a calibration complete signal when the chip completes the resistance calibration operation, and the second calibration pin is configured to receive, when another chip completes the resistance calibration operation, the calibration complete signal output by the another chip;

the first calibration pin of the first chip is connected to the second calibration pin of the second chip, and the second calibration pin of the first chip is connected to the first calibration pin of the second chip; and the first calibration pin of the third chip is connected to the second calibration pin of the fourth chip, and the second calibration pin of the third chip is connected to the first calibration pin of the fourth chip.

8. The semiconductor apparatus according to claim 7, wherein the semiconductor apparatus further comprises a second calibration resistor, both the third chip and the fourth chip are coupled to the second calibration resistor, and the third chip and the fourth chip are configured to perform the resistance calibration operation through the second calibration resistor.

9. The semiconductor apparatus according to claim 7, wherein the semiconductor apparatus further comprises:

a fifth chip, a sixth chip, and a third calibration resistor; the fifth chip is stacked on the third chip, and the sixth chip is stacked on the fourth chip;

all of the first chip, the second chip, the third chip, and the fourth chip are coupled to the first calibration resistor; both the fifth chip and the sixth chip are coupled to the third calibration resistor; and the first chip, the second chip, the third chip, and the fourth chip are configured to perform the resistance calibration operation through the first calibration resistor; and the fifth chip and the sixth chip are configured to perform the resistance calibration operation through the third calibration resistor.

10. The semiconductor apparatus according to claim 9, wherein the fuse circuit is further configured to generate a fifth signal through fuse burning, and output the fifth signal; and the arbiter circuit is further connected to the fuse circuit, and the arbiter circuit is further configured to determine, based on the master/slave determining signal and the fifth signal, a sequence of executing the command by the chip in which the arbiter circuit is located in a plurality of chips.

11. The semiconductor apparatus according to claim 10, wherein the arbiter circuit determines that the chip in which the arbiter circuit is located is the first one performing the resistance calibration operation when the master/slave determining signal is at a first level and the fifth signal is at the first level;

the arbiter circuit determines that the chip in which the arbiter circuit is located is the second one performing the resistance calibration operation when the master/slave determining signal is at a first level and the fifth signal is at a second level;

the arbiter circuit determines that the chip in which the arbiter circuit is located is the third one performing the resistance calibration operation when the master/slave determining signal is at a second level and the fifth signal is at a first level; or the arbiter circuit determines that the chip in which the arbiter circuit is located is the fourth one performing the resistance calibration operation when the master/slave determining signal is at a second level and the fifth signal is at the second level.

12. The semiconductor apparatus according to claim 2, wherein the fuse circuit is further configured to generate a sixth signal through fuse burning, and output the sixth signal; and the arbiter circuit is further connected to the fuse circuit, and the fuse circuit is further configured to enable or disable the arbiter circuit through the sixth signal.

13. The semiconductor apparatus according to claim 1, wherein the fuse circuit is further configured to adjust, through the first signal, a pin order of a plurality of command address signals input to the chip.

14. A memory, comprising the semiconductor apparatus according to claim 1.

15. An electronic device, comprising the semiconductor apparatus according to claim 1.

* * * * *